(12) United States Patent
Sudo et al.

(10) Patent No.: US 8,587,189 B2
(45) Date of Patent: Nov. 19, 2013

(54) ORGANIC LIGHT-EMITTING ELEMENT, LIGHT-EMITTING APPARATUS, IMAGE FORMING APPARATUS, DISPLAY APPARATUS, AND IMAGE PICKUP APPARATUS

(75) Inventors: Shoji Sudo, Kawasaki (JP); Yojiro Matsuda, Kawasaki (JP); Kengo Kishino, Tokyo (JP); Naoyuki Ito, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/539,937

(22) Filed: Jul. 2, 2012

(65) Prior Publication Data

US 2013/0011161 A1   Jan. 10, 2013

(30) Foreign Application Priority Data

Jul. 6, 2011   (JP) .................................. 2011-149924

(51) Int. Cl.
*H01L 51/54* (2006.01)
(52) U.S. Cl.
USPC ......................................................... 313/503

(58) Field of Classification Search
USPC .................................................. 313/503–506
See application file for complete search history.

(56) References Cited

U.S. PATENT DOCUMENTS

| | | | | |
|---|---|---|---|---|
| 6,916,552 | B2 * | 7/2005 | Ueda et al. ..................... | 428/690 |
| 7,944,144 | B2 * | 5/2011 | Gomi ............................ | 313/512 |
| 2004/0212297 | A1 * | 10/2004 | Nakamura .................... | 313/504 |
| 2005/0264181 | A1 * | 12/2005 | Shibasaki et al. ............. | 313/503 |
| 2007/0182316 | A1 * | 8/2007 | Mathai et al. ................. | 313/504 |
| 2007/0285010 | A1 * | 12/2007 | Lee et al. ...................... | 313/504 |
| 2011/0043103 | A1 * | 2/2011 | Morishima ................... | 313/504 |

FOREIGN PATENT DOCUMENTS

JP   2008-171637 A   7/2008

* cited by examiner

*Primary Examiner* — Donald Raleigh
(74) *Attorney, Agent, or Firm* — Canon U.S.A., Inc., IP Division

(57) ABSTRACT

An organic light-emitting element includes a first electrode, an organic compound layer, and a second electrode on a substrate and emits light from the second electrode side, wherein the second electrode includes a first layer and a second layer in contact with the first layer sequentially from the substrate side, the second layer is a layer comprising Ag, and the first layer is a layer comprising Ag and Cs.

9 Claims, 4 Drawing Sheets

ORGANIC LIGHT-EMITTING ELEMENT, LIGHT-EMITTING APPARATUS, IMAGE FORMING APPARATUS, DISPLAY APPARATUS, AND IMAGE PICKUP APPARATUS

BACKGROUND OF THE INVENTION

1. Field of the Invention

The present invention relates to an organic light-emitting element having a configuration in which a silver thin film is used as an electrode and exhibiting a high luminous efficiency, and a light-emitting apparatus, an image forming apparatus, a display apparatus, and an image pickup apparatus, which include the organic light-emitting element.

2. Description of the Related Art

The organic light-emitting element is formed from a first electrode, a second electrode, and an organic compound layer disposed between the two electrodes. The light emitted from a light-emitting layer in the organic compound layer is released from one electrode (light take-out electrode) of the first electrode and the second electrode. Regarding the organic light-emitting element, in order to realize low-voltage driving and a high luminous efficiency, a metal, e.g., silver, exhibiting high electrical conductivity and low optical absorption in a visible light region is used as the light take-out electrode.

However, in the case where silver is used as the light take-out electrode, optical absorption intrinsic to silver may occur depending on the film formation environment. In order to suppress absorption by the silver thin film, Japanese Patent Laid-Open No. 2008-171637 discloses an organic light-emitting element by using a stacked transparent electroconductive film, which is composed of an underlying layer formed from a metal other than silver and a silver thin film layer formed from silver or a silver alloy, as an electrode. Furthermore, it is disclosed that the metal other than silver of the underlying layer can be selected from the group consisting of gold, aluminum, copper, indium, tin, and zinc.

SUMMARY OF THE INVENTION

Aspects of the present invention provide an organic light-emitting element including a silver thin film as a light take-out electrode and exhibiting a high luminous efficiency.

An organic light-emitting element according to aspects of the present invention includes a first electrode, a second electrode, and an organic compound layer disposed between the above-described first electrode and the above-described second electrode and provided with a light-emitting layer on a substrate and emits light from the above-described second electrode side, wherein the above-described second electrode includes a first layer and a second layer in contact with the above-described first layer sequentially from the above-described substrate side, the above-described second layer is a layer comprising Ag, and the above-described first layer is a layer comprising Ag and Cs.

According to aspects of the present invention, an organic light-emitting element which has a high luminous efficiency and which can be driven at low voltages is provided.

Further features of the present invention will become apparent from the following description of exemplary embodiments with reference to the attached drawings.

DESCRIPTION OF THE EMBODIMENTS

Figure 1:
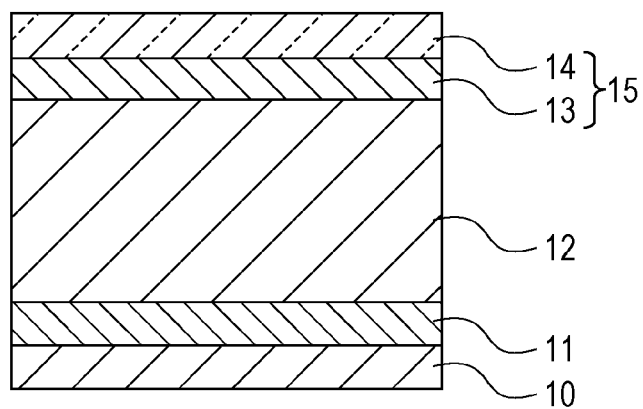
FIG. 1 is a schematic diagram of an organic light-emitting element according to a first embodiment.

Aspects of the present invention will be described below with reference to drawings. FIG. 1 shows a schematic sectional view of an organic light-emitting element according to a first embodiment of the present invention. The organic light-emitting element according to the first embodiment of the present invention includes a first electrode 11, a second electrode 15, and an organic compound layer 12 disposed between the first electrode 11 and the second electrode 15 and provided with a light-emitting layer on a substrate 10. The organic light-emitting element shown in FIG. 1 has a configuration in which the light is taken out from the second electrode 15 side and, therefore, the light is taken out from the side opposite to the substrate 10 (a so-called top emission type). The second electrode 15 includes a first layer 13 and a second layer 14 in contact with the first layer 13 sequentially from the substrate 10 side. The second layer 14 is a layer containing silver (Ag) and the light in a visible light region can pass through the second layer 14. The first layer 13 containing Ag and Cs is disposed as an underlying layer of the second layer 14.

Although not specifically shown in the drawing, aspects of the present invention can also be applied to a so-called bottom emission type organic light-emitting element in which a second electrode, an organic compound layer, and a first electrode are stacked sequentially from the substrate side. In this case as well, the second electrode has a configuration in which the first layer and the second layer are stacked sequentially from the substrate side. Furthermore, aspects of the present invention can also be applied to a double-sided organic light-emitting element, wherein the light is taken out from the substrate side and the side opposite to the substrate. Concretely, the organic light-emitting element may be an organic light-emitting element including a substrate, a transmission first electrode, an organic compound layer, and a transmission second electrode, wherein the second electrode is disposed by stacking a first layer and a second layer sequentially from the substrate side.

The second layer 14 of the second electrode 15 used in the first embodiment of the present invention is a layer containing Ag. In this regard, the layer containing Ag refers to a layer containing 90 percent by weight or more of Ag. The film thickness of the second layer 14 is preferably 5 nm or more and 25 nm or less from the viewpoint of the electrical conductivity and the transmittance in the visible light region (wavelength of 400 nm to 780 nm). The second layer 14 can be formed by a known method, e.g., an evaporation method or a sputtering method.

In general, it is believed that a Ag thin film is present not in the state of a continuous film, but in the state of Ag fine particles having various particle diameters because of high cohesiveness thereof and it is believed that plasmon absorption is exhibited in the visible light region.

Meanwhile, the second electrode 15 of the organic light-emitting element according to the first embodiment of the present invention includes the first layer 13 containing at least Ag and Cs as an underlying layer of the above-described second layer 14 containing Ag. The first layer 13 containing Ag and Cs can be formed by a known method, e.g., a co-evaporation method of a Ag metal and a Cs metal or a Cs compound or a sputtering method.

The reason for this is believed to be as described below. A Cs atom has strong chemical attraction for a Ag atom. Therefore, in the first layer 13, cohesion of Ag atoms is prevented so that the first layer 13 is formed as a continuous film easily. Likewise in the second layer 14 which is formed on the first layer 13 and which contains Ag, Cs atoms in the first layer 13 prevent cohesion of Ag atoms and, in addition, the second layer 14 is formed into a continuous film easily under the influence of the first layer 13 which is a continuous film. As a result, presence of Ag as fine particles is reduced and, thereby, optical absorption, e.g., plasmon absorption, is suppressed.

The film thickness of the first layer 13 is preferably 0.5 nm or more and 20 nm or less. If the film thickness is larger than 20 nm, the transmittance of the second electrode 15 is reduced, and if the film thickness is less than 0.5 nm, the first layer 13 is not formed into a continuous film easily and an effect of suppressing chemical absorption by Ag is not obtained easily.

Next, other constituent factors of the organic light-emitting element will be described. As for the substrate 10, a dielectric material, e.g., glass or plastic, can be used. The substrate 10 may be formed from a support substrate, a switching element disposed thereon, and an insulating layer disposed thereon. As for the switching element, for example, a transistor, e.g., TFT, or MIM can be used.

The first electrode 11 can have high reflectivity and a metal layer of Al, Ag, Mo, W, Ni, Cr, or an alloy thereof having a film thickness of 50 nm or more and 300 nm or less can be used. This metal layer can be formed by a known method, e.g., an evaporation method or a sputtering method. Furthermore, the first electrode 11 may have a configuration in which a transparent oxide electroconductive layer of tin oxide, indium oxide, indium tin oxide, indium zinc oxide, or the like is stacked on the light take-out side of the metal layer.

The organic compound layer 12 is configured to include at least a light-emitting layer and, as necessary, functional layers, e.g., a hole injection layer, a hole transportation layer, a hole block layer, an electron injection layer, an electron transportation layer, an electron block layer, and an exciton block layer, where the individual functional layers are stacked in an appropriate order. As for the materials constituting the individual functional layers used in the organic compound layer, known materials can be used.

It is possible that the above-described transparent oxide electroconductive film, an organic compound layer of lithium fluoride, a material to constitute an organic light-emitting element, or the like, and an inorganic layer of aluminum oxide, silicon oxide, or silicon nitride as an optical adjustment layer and a protective layer are disposed on the second electrode 15.

The organic light-emitting element according to aspects of the present invention can be used for a light-emitting apparatus and a display apparatus. The light-emitting apparatus and the display apparatus according to the present embodiment further include control circuit to control light emission of the organic light-emitting element, and the light is emitted from the organic light-emitting element on the basis of passive matrix drive or active matrix drive. As for the active matrix drive, a switching element, e.g., a transistor or MIM, is provided.

Examples of light-emitting apparatuses include exposure light sources for illuminating apparatuses and electrophotographic image forming apparatuses and backlights of liquid crystal display apparatuses. As for the use in the illuminating apparatus, one organic light-emitting element may be employed or a plurality of organic light-emitting elements may be employed. As for the exposure light source for the electrophotographic image forming apparatus, a plurality of organic light-emitting elements can be used. The image forming apparatus includes an exposure light source, a photo conductor to be provided with a latent image by the exposure light source, and a charging unit to charge the photo conductor.

Figure 2A:
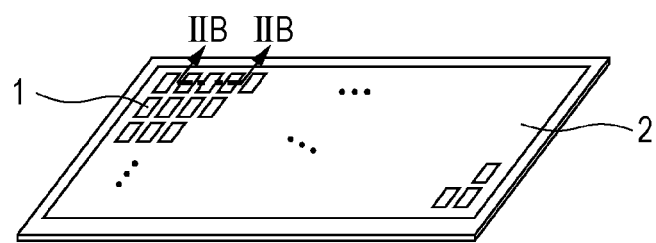
FIGS. 2A and 2B are schematic diagrams of a display apparatus according to a second embodiment.

FIG. 2A is a schematic perspective view of a display apparatus according to the present embodiment. The display apparatus according to the present embodiment includes a plurality of pixels 1 provided with the organic light-emitting element. The plurality of pixels 1 are arranged in the matrix so as to form a display region 2. In this regard, the pixel refers to a region corresponding to a light-emitting region of one light-emitting element. In the display apparatus according to the present embodiment, the light-emitting element is an organic light-emitting element, and in the display apparatus, one color organic light-emitting element is disposed on a pixel 1 basis. Examples of light-emitting colors of the organic light-emitting element include red, green, and blue, and besides them, yellow and cyan may be mentioned. In the display apparatus according to the present embodiment, a plurality of pixel units formed from a plurality of pixels having different light-emitting colors (for example, a pixel to emit red, a pixel to emit green, and a pixel to emit blue) are arranged. The pixel unit refers to a minimum unit capable of emitting light of a desired color by color mixing of the individual pixels.

Figure 2B:
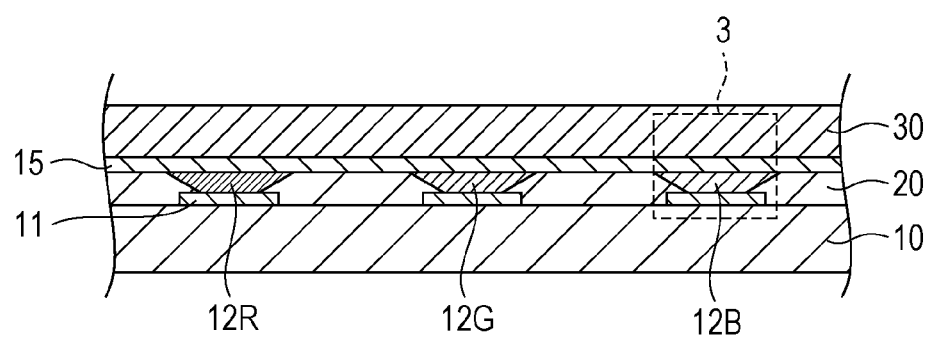

FIG. 2B is a schematic partial sectional view of a section taken along a line IIB-IIB shown in FIG. 2A. One pixel includes an organic light-emitting element 3 provided with a first electrode 11, an organic compound layer 12R, 12G, or 12B, and a second electrode 15 on a substrate 10. The organic light-emitting element 3 according to the present embodiment of the present invention is configured to have a reflection surface to reflect the light, which is emitted from the light-emitting layer and which is headed for the first electrode 11, on the first electrode 11 and release the light from the second electrode 15. Therefore, a so-called top emission type display apparatus is shown. Meanwhile, the organic light-emitting element according to the present invention can also be applied to a bottom emission type display apparatus, where the light is taken out from the substrate 10 side.

The organic compound layer 12R is an organic compound layer to emit red, the organic compound layer 12G is an organic compound layer to emit green, and the organic compound layer 12B is an organic compound layer to emit blue. The organic compound layers 12R, 12G, and 12B are patterned in correspondence with pixels (organic light-emitting element 3) which emit red, green, and blue, respectively. The layers other than the light-emitting layer in the organic compound layer 12 may be formed while being shared with the individual pixels. The first electrode 11 is formed while being isolated from the first electrode 11 of an adjacent pixel (organic light-emitting element 3). In order to prevent an occurrence of short circuit between the first electrode 11 and the second electrode 15 because of foreign substances, an insulating layer 20 is disposed between pixels (more concretely, first electrodes 11). Furthermore, a protective layer 30 to protect the organic light-emitting element from moisture and the like is disposed on the second electrode 15.

Regarding the display apparatus according to the present embodiment, in the configuration in which the light-emitting layer of the organic light-emitting element 3 of the pixel 1 is a white emitting layer, the light-emitting layer may be formed while being shared with the individual pixels. In that case, color display may be employed by using a color filter and the like.

This display apparatus is used for display portions of a television system and a personal computer. In addition, the display apparatus according to the present embodiment may be disposed in display portions and electronic viewfinders of image pickup apparatuses, e.g., digital cameras and digital video cameras. The image pickup apparatus further includes image pickup elements, e.g., an image pickup optical system and a CMOS sensor, to pick up an image.

The display apparatus according to the present embodiment may be disposed in a display portion of a cellular phone, a display portion of a hand-held video game machine, and the like and, furthermore, be disposed in a display portion of a portable music player, a display portion of a personal digital assistant (PDA), and a display portion of a car navigation system.

The display apparatus according to the present embodiment may be disposed in an operation panel portion of an image forming apparatus. As described above, the image forming apparatus further includes an exposure light source, a photo conductor to be provided with a latent image by the exposure light source, and a charging unit to charge the photo conductor.

EXAMPLES

The measurement results of the absorbance of the configuration in which a stacked film formed by stacking a first layer and a second layer was stacked on an organic compound layer are shown.

Example 1

In the present example, an organic compound layer was formed on a glass substrate, a layer containing Ag and Cs was formed thereon as a first layer, and a Ag thin film layer was further formed thereon as a second layer.

On a glass substrate (20 mm long×20 mm wide×0.9 mm thick), Compound 1 described below having a thickness of 20 nm was formed as an organic compound layer. A layer containing Ag and Cs at an atomic ratio of Ag and Cs of 1:0.010 and having a thickness of 4 nm was formed thereon as a first layer. This first layer was formed from Ag and $Cs_2CO_3$ by a co-evaporation method. The degree of vacuum in a vacuum chamber during film formation of the first layer was $5\times10^{-4}$ Pa or less. The atomic ratio of Ag and Cs is expressed by two significant figures.

As a second layer, a Ag thin film layer was formed on the first layer in such a way that the film thickness became 5, 10, 15, 20, 25, or 30 nm. The degree of vacuum in the vacuum chamber during film formation of the second layer was $5\times10^{-4}$ Pa or less.

In order to prevent alteration of the resulting stacked film formed on the glass substrate in the air, the surface, which was provided with the film, of the glass substrate was sealed in a nitrogen atmosphere by using sealing glass (18 mm long×18 mm wide×0.7 mm thick) containing a desiccant and an UV-curable resin.

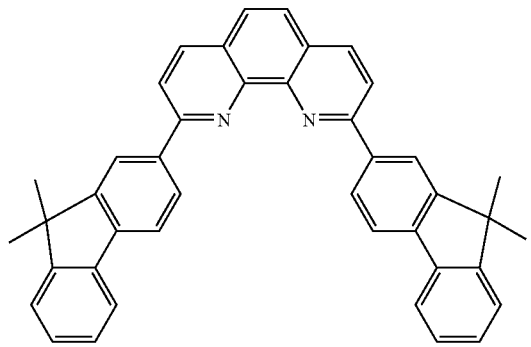

Compound 1

Example 2

The present example was different from Example 1 in that a layer containing Ag and Cs at an atomic ratio of Ag and Cs of 1:0.13 and having a thickness of 4 nm was formed as the first layer. The other conditions were the same as those in Example 1.

Comparative Example 1

The present comparative example was different from Example 1 in that the first layer was not formed, but only the second layer was formed. The other conditions were the same as those in Example 1.

Measurements of Transmittance, Reflectivity, and Absorbance

The transmittance, the reflectivity, and the absorbance in Examples 1 and 2 and Comparative example 1 were measured. The transmittance and the reflectivity were measured by using SolidSpec-3700 (produced by SHIMADZU CORPORATION), and the absorbance was calculated on the basis of 100−(transmittance+reflectivity). The measurement was performed under the condition that the incident angle of the transmitting light used in the transmittance measurement was 0 degrees, and the incident angle of the reflected light in reflectivity measurement was 5 degrees.

Figure 3A:
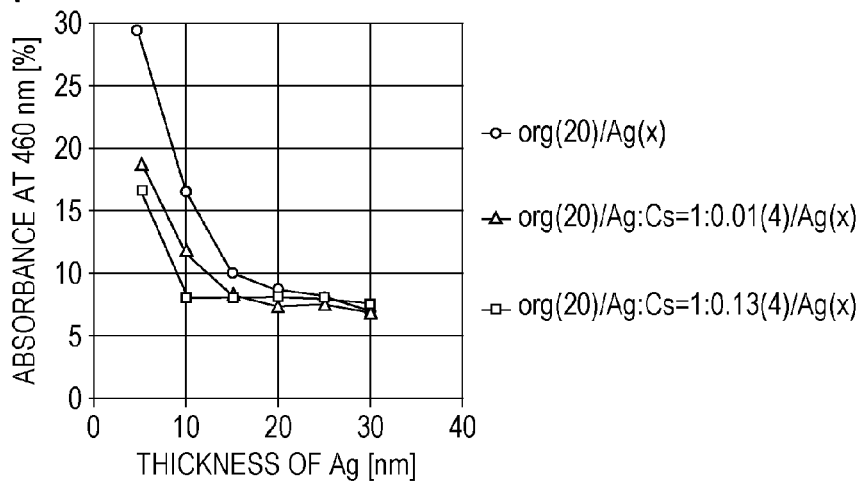
FIGS. 3A to 3C are diagrams showing the absorbances in Examples 1 and 2 and Comparative example 1.
Figure 3B:
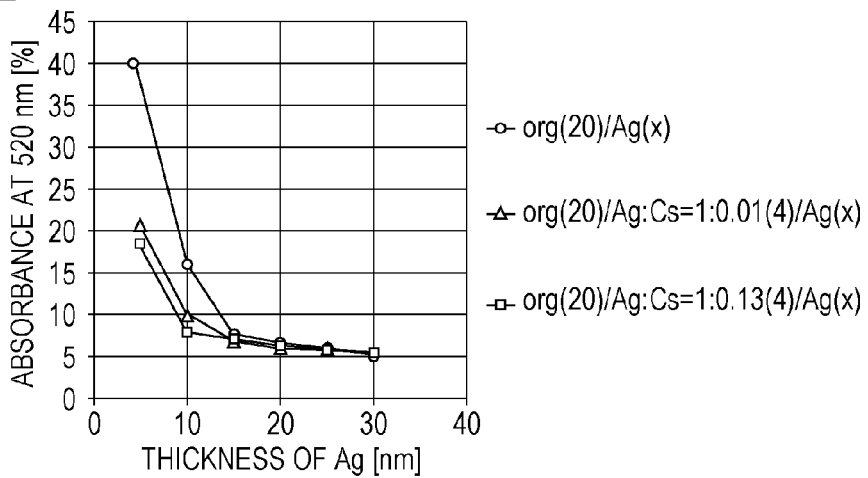
Figure 3C:
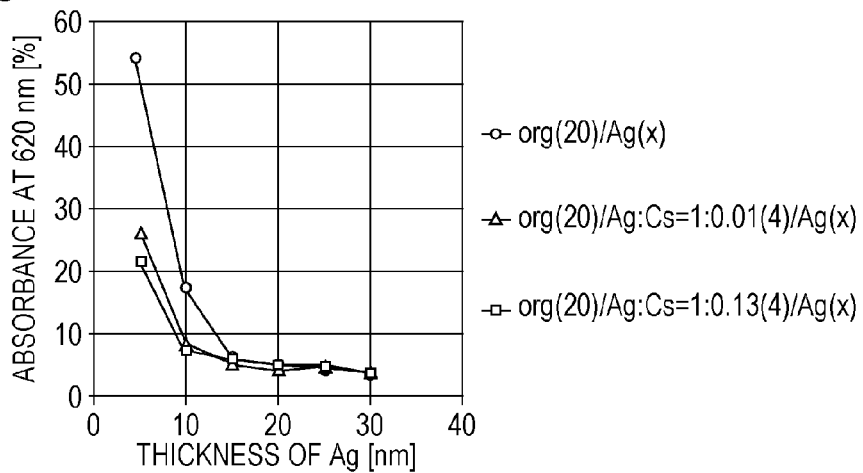

FIGS. 3A to 3C show the results of calculation of the absorbances in Examples 1 and 2 and Comparative example 1 at 460 nm (blue region), 520 nm (green region), and 620 nm (red region). According to FIGS. 3A to 3C, regarding the configuration in which the first layer containing Ag and Cs was disposed, in the case where the film thickness of Ag was 5 nm or more and 25 nm or less, the absorbance was low in at least the blue region, and the absorbances in the green region and the red region were the same or low as compared with those of the configuration in which a Ag film was disposed directly on the organic compound. In the case where the film thickness of Ag was larger than 25 nm, when the atomic ratio of Ag and Cs in the first layer was 1:0.13, the absorbance in the blue region of the configuration in which the first layer was disposed was higher than that of the configuration in which the first layer was not disposed. Consequently, it is clear that light absorption of the second layer formed from Ag having a film thickness of 25 nm or less can be suppressed by disposing the first layer containing Ag and Cs.

Example 3

In the present example, Organic compound 1 described above was formed having a film thickness of 20 nm on a glass substrate, a first layer containing Ag and Cs and having a film thickness of 4 nm was formed thereon, and Ag having a film thickness of 10 nm was further formed thereon as a second layer. Here, the individual first layers were formed having different concentrations while the atomic ratios of Ag and Cs were within the range of 1:0.010 to 1:4.0. Concretely, the first layers were formed in such a way that the ratios of the number of atoms became 1:0.010, 1:0.025, 1:0.055, 1:0.13, 1:0.34, 1:0.51, 1:0.75, 1:1.2, 1:2.0, and 1:4.0. The other conditions were the same as those in Example 1.

Comparative Example 2

As for Comparative example 2, the second layer in Comparative example 1 was formed from Ag having a film thickness of 10 nm. The other conditions were the same as those in Comparative example 1.

Comparative Example 3

Comparative example 3 was different from Example 3 in that only $Cs_2CO_3$ having a film thickness of 4 nm was formed as the first layer. The other conditions were the same as those in Example 3.

Measurements of Transmittance, Reflectivity, and Absorbance

The transmittance, the reflectivity, and the absorbance in Example 3 and Comparative examples 2 and 3 were measured in the same manner as those in Examples 1 and 2 and Comparative example 1.

Figure 4A:
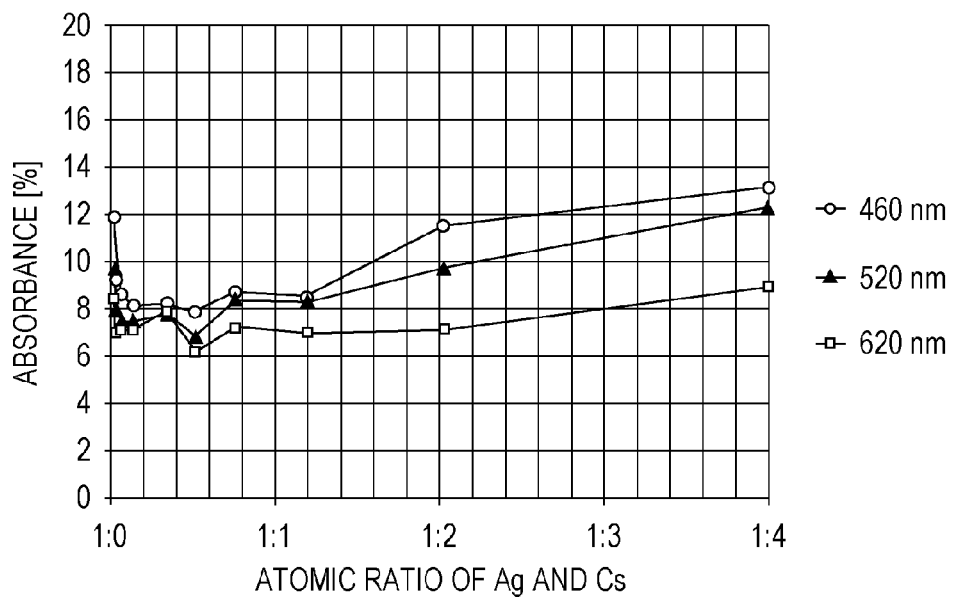
FIGS. 4A and 4B are diagrams showing the absorbances in Example 3.
Figure 4B:
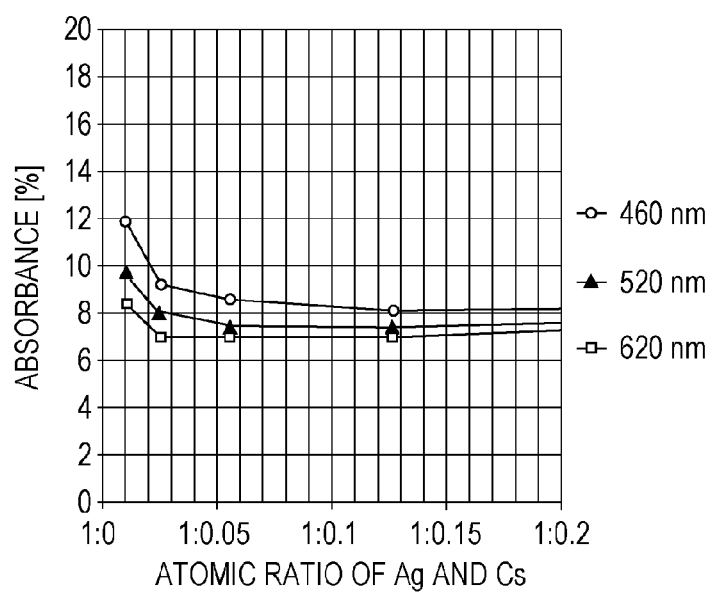

FIGS. 4A and 4B show the results of calculation of the absorbances at 460 nm, 520 nm, and 620 nm on the basis of the transmittance and the reflectivity obtained in Example 3. FIG. 4B is a magnified diagram of a part of FIG. 4A where the range of the atomic ratio of Ag and Cs is 1:0.010 to 1:0.20. Table 1 show the results of calculation of the absorbances at 460 nm, 520 nm, and 620 nm on the basis of the transmittance and the reflectivity obtained in Comparative examples 2 and 3.

TABLE 1

| | Absorbance (%) | | |
|---|---|---|---|
| | 460 (nm) | 520 (nm) | 620 (nm) |
| Comparative example 2 | 16.6 | 15.8 | 17.4 |
| Comparative example 3 | 18.9 | 16.2 | 11.2 |

As is clear from FIGS. 4A and 4B and Table 1, regarding the configuration in which the first layer containing Ag and Cs was disposed, the absorbance was low as compared with those of the configuration in which the second layer was disposed directly on the organic compound layer and the configuration in which a layer formed from only $Cs_2CO_3$ was disposed as the first layer. The first layer may be disposed having a configuration in which the atomic ratio of Ag and Cs is preferably within the range of 1:0.010 to 1:4.0. The first layer may be disposed having a configuration in which the atomic ratio of Ag and Cs is more preferably within the range of 1:0.025 to 1:1.2. Furthermore, it is clear that the absorbance is still lower in the case where the first layer is disposed having a configuration in which the atomic ratio of Ag and Cs becomes within the range of 1:0.05 to 1:1.2. It is optimum that the first layer is disposed having a configuration in which the atomic ratio of Ag and Cs becomes within the range of 1:0.13 to 1:0.51.

Example 4

The present example is an example of an organic light-emitting element which emits blue and FIG. 1 shows a configuration example thereof. A film of aluminum alloy (AlNd) having a film thickness of 100 nm was formed on a glass substrate 10 by a sputtering method, a film of indium tin oxide having a film thickness of 40 nm was formed by the sputtering method and, thereby, a first electrode 11 was formed.

An organic compound layer 12 was formed. A film of Compound 2 described below having a film thickness of 80 nm was formed, so as to form a first hole transportation layer. A film of Compound 3 described below having a film thickness of 10 nm was formed, so as to form a second hole transportation layer. Compound 4 described below and Compound 5 described below were co-evaporated at film formation rates of 0.98 Å/s and 0.02 Å/s, respectively, so as to form a light-emitting layer having a film thickness of 25 nm. A film of Compound 6 described below having a film thickness of 10 nm was formed, so as to form a first electron transportation layer. A film of Compound 1 described below having a film thickness of 30 nm was formed, so as to form a second electron transportation layer.

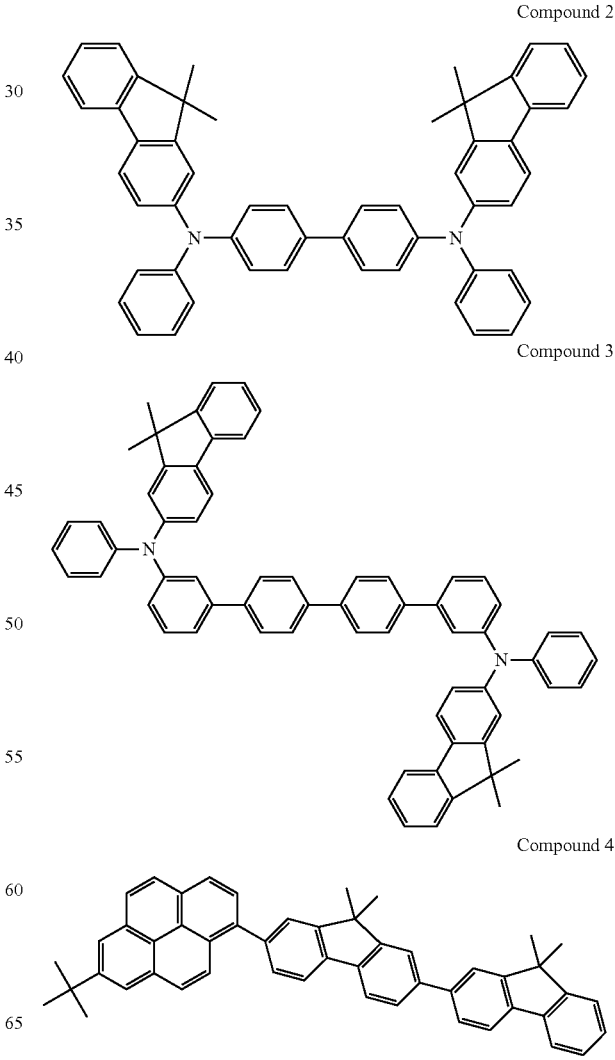

Compound 2

Compound 3

Compound 4

Compound 5

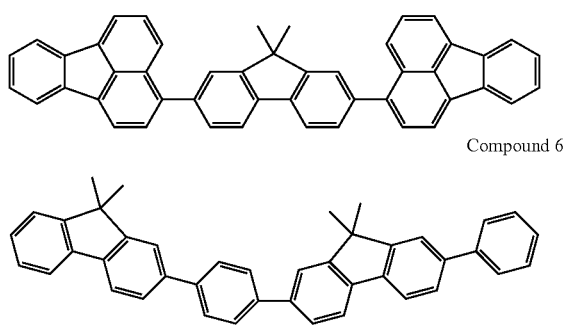

Compound 6

A layer having an atomic ratio of Ag and Cs of 1:0.010 and having a film thickness of 4 nm was formed from Ag and $Cs_2CO_3$ as a first layer 13 of a second electrode 15 by a co-evaporation method. A second layer of the second electrode 15 was formed from Ag having a film thickness of 10 nm by an evaporation method.

The degree of vacuum in a vacuum chamber during film formation of the organic compound layer 12 and the second electrode 15 was $5 \times 10^{-4}$ Pa or less.

In order to prevent alteration of the layers formed on the glass substrate in the air, the surface, which was provided with the films, of the glass substrate was sealed in a nitrogen atmosphere by using sealing glass (18 mm long×18 mm wide×0.7 mm thick) containing a desiccant and an UV-curable resin.

Example 5

Example 5 was different from Example 4 in that the first layer 13 was formed in such a way as to have an atomic ratio of Ag and Cs of 1:0.13. The other film formation conditions and the sealing method were the same as those in Example 4.

Comparative Example 4

Comparative example 4 was different from Example 4 in that a layer formed from only $Cs_2CO_3$ was disposed as the first layer 13 of the second electrode 15. The other film formation conditions and the sealing method were the same as those in Example 4.

Evaluation of Element

Regarding blue organic light-emitting elements produced in Examples 4 and 5 and Comparative example 4, the luminous efficiency and the chromaticity were measured. The luminous efficiency was measured by using BM7-Fast produced by TOPCON and the chromaticity was measured by using SR-3 produced by TOPCON.

Table 2 shows the absorbances at 460 nm of the configurations of the second electrodes 15 in Examples 4 and 5 and Comparative example 4, which are shown in FIGS. 4A and 4B and Table 1, and the luminous efficiencies and chromaticities obtained in Examples 4 and 5 and Comparative example 4. In this regard, Ag:Cs=0:1.0 represent the configuration in which the first layer 13 was formed from only $Cs_2CO_3$. The luminous efficiency and the chromaticity are at a current density of 10 mA/cm². As is clear from Table 2, there is a correlation between the absorbance and the luminous efficiency and a high luminous efficiency can be obtained by using the configuration of the second electrode 15, in which the absorbance is low.

TABLE 2

| | Configuration of first layer | Absorbance at 460 nm | Luminous efficiency | Chromaticity | |
|---|---|---|---|---|---|
| | Ag:Cs | (%) | (cd/A) | CIEx | CIEy |
| Example 4 | 1:0.01 | 11.9 | 2.80 | 0.138 | 0.060 |
| Example 5 | 1:0.13 | 8.1 | 2.86 | 0.139 | 0.060 |
| Comparative example 4 | 0:1.00 | 18.9 | 2.44 | 0.141 | 0.059 |

Consequently, it is clear that an organic light-emitting element having a high luminous efficiency is obtained by using a layer formed from Ag and Cs, which suppresses light absorption by the Ag thin film used in the second layer 14, as the first layer 13 in the second electrode 15.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-149924 filed Jul. 6, 2011, which is hereby incorporated by reference herein in its entirety.

What is claimed is:

1. An organic light-emitting element comprising a first electrode, a second electrode, and an organic compound layer disposed between the first electrode and the second electrode and provided with a light-emitting layer on a substrate, the organic light-emitting element emitting light from the second electrode side,
   wherein the second electrode includes a first layer and a second layer in contact with the first layer sequentially from the substrate side,
   the second layer is a layer comprising Ag, and
   the first layer is a layer comprising Ag and Cs
   wherein the atomic ratio of Ag to Cs contained in the first layer is within the range of 1:0.001 to 1:1.2.

2. The organic light-emitting element according to claim 1, wherein the atomic ratio of Ag to Cs contained in the first layer is within the range of 1:0.025 to 1:1.2.

3. The organic light-emitting element according to claim 1, wherein the atomic ratio of Ag to Cs contained in the first layer is within the range of 1:0.055 to 1:1.2.

4. The organic light-emitting element according to claim 1, wherein the atomic ratio of Ag to Cs contained in the first layer is within the range of 1:0.13 to 1:0.51.

5. The organic light-emitting element according to claim 1, wherein the film thickness of the second layer is 5 nm or more and 25 nm or less.

6. A light-emitting apparatus comprising the organic light-emitting element according to claim 1 and a control circuit to control light emission of the organic light-emitting element.

7. An image forming apparatus comprising the light-emitting apparatus according to claim 6, a photo conductor to be provided with a latent image by the light-emitting apparatus, and a charging unit to charge the photo conductor.

8. A display apparatus comprising a plurality of organic light-emitting elements to emit different colors and a control circuit to control light emission of the organic light-emitting elements,
   wherein the organic light-emitting element is the organic light-emitting element according to claim 1.

9. An image pickup apparatus comprising the display apparatus according to claim 8 and an image pickup element.

* * * * *